United States Patent [19]

Maurel et al.

[11] Patent Number: 5,627,100

[45] Date of Patent: May 6, 1997

[54] METHOD FOR THE MAKING OF SURFACE-EMITTING LASER DIODES WITH MECHANICAL MASK, THE APERTURES HAVING INCLINED FLANKS

[75] Inventors: Philippe Maurel, Sevres; Jean-Charles Garcia, Athis-Mons; Jean-Pierre Hirtz, L'Haye Les Roses, all of France

[73] Assignee: Thomson-CSF, Paris, France

[21] Appl. No.: 524,907

[22] Filed: Sep. 7, 1995

[30] Foreign Application Priority Data

Sep. 16, 1994 [FR] France .................................. 94 11071

[51] Int. Cl.⁶ .................................................. H01R 21/22
[52] U.S. Cl. ............................. 438/32; 438/34; 438/39; 438/943; 117/105
[58] Field of Search ........................... 437/948, 155, 437/35, 36; 148/DIG. 102, DIG. 103, DIG. 104, DIG. 105, DIG. 106

[56] References Cited

U.S. PATENT DOCUMENTS

| | | |
|---|---|---|
| 4,217,597 | 8/1980 | Hirtz . |
| 4,236,122 | 11/1980 | Cho et al. . |
| 4,286,238 | 8/1981 | Ursenbach . |
| 4,394,182 | 7/1983 | Maadox, III ............................. 437/36 |
| 4,445,130 | 4/1984 | Poulain et al. . |
| 4,485,391 | 11/1984 | Poulain et al. . |
| 4,494,237 | 1/1985 | Di Forte Poisson et al. . |
| 4,910,168 | 3/1990 | Tsai ............................. 148/DIG. 102 |
| 4,950,622 | 8/1990 | Kwon et al. ............................. 437/129 |
| 5,001,719 | 3/1991 | Trussel . |
| 5,012,476 | 4/1991 | Razeghi et al. . |
| 5,106,823 | 4/1992 | Creuzet et al. . |
| 5,138,407 | 8/1992 | Hirtz et al. . |
| 5,272,106 | 12/1993 | Hirtz et al. . |
| 5,273,929 | 12/1993 | Hirtz et al. . |
| 5,328,854 | 7/1994 | Vakhshoori et al. ....................... 437/35 |
| 5,378,658 | 1/1995 | Toyoda et al. ........................... 437/228 |
| 5,427,983 | 6/1995 | Ahmad et al. ................. 148/DIG. 105 |

FOREIGN PATENT DOCUMENTS 0369856  5/1990  European Pat. Off. .

OTHER PUBLICATIONS

Applied Physics Letters, vol. 61, No. 13, Sep. 28, 1992, pp. 1487–1489; Donnelly, J. P., et al.; High Quantum Efficiency Monolithic Arrays of Surface–Emitting Algaas Diode Lasers With Dry–Etched Vertical Facets and Parabolic Deflecting Mirrors'.

Primary Examiner—R. Bruce Breneman
Assistant Examiner—Ramamohan Rao Paladugu
Attorney, Agent, or Firm—Oblon, Spivak, McClelland, Maier & Neustadt, P.C.

[57] ABSTRACT

A method for making a set of surface-emitting laser diodes comprises the making of reflectors by the epitaxial growth of at least one semiconductor material through a mask having apertures with inclined flanks. This method leads to the obtaining of the Bragg reflectors obtained in situ, removing the need for the ion etching of a semiconductor substrate followed by a phase for the conditioning of the surface of the sample before the preparation of the desired laser structure. Application: optical power source.

6 Claims, 4 Drawing Sheets

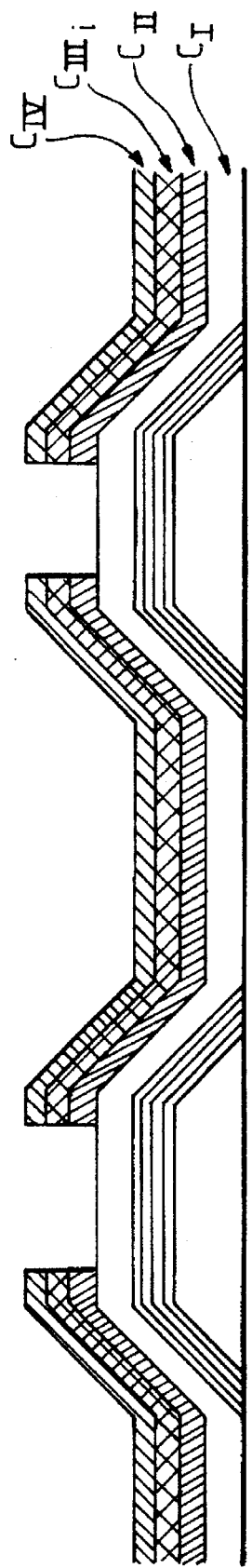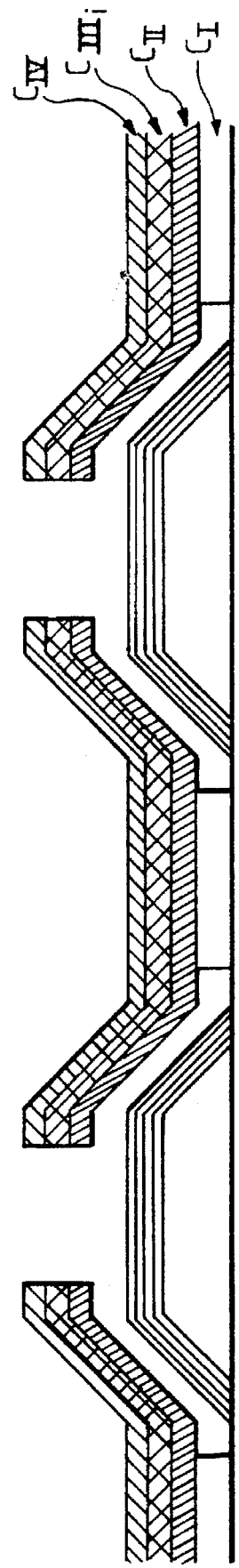

METHOD FOR THE MAKING OF SURFACE-EMITTING LASER DIODES WITH MECHANICAL MASK, THE APERTURES HAVING INCLINED FLANKS

BACKGROUND OF THE INVENTION

1. Field of the Invention

The field of the invention is that of optoelectronic power devices, the active part of which is constituted by an integrated circuit assembling a plurality of semiconductor lasers.

More specifically, this integrated circuit brings together a plurality of elementary lasers capable of generating power in the range of one watt and hence capable of having optical sources of power of nearly one kilowatt. Typically, these elementary lasers are associated in mutually parallel linear arrays or strips on the chip of semiconductor material. The arrays are raised with respect to the surface of the substrate in such a way that they have two raised faces needed for the operation of each elementary laser. These faces are parallel to the surface of the substrate. Two sets of mirrors, positioned between the laser arrays, reflect the light beams at 90° and send them back perpendicularly to the surface of the substrate. These mirrors are generally formed by the machining of the substrate in planes inclined at 45° and are then covered with at least one metal layer that is used both as an optical reflector and as an electrical conductor. In general, a first contact-making metallization is deposited on each laser array ($M_e$) and a second contact-making metallization ($M_R$) is deposited on each reflector. All the flanks of the reflectors are also covered with a metallization ($M'_R$) to provide said reflective elements with high reflecting capacity. FIG. 1 shows a view in perspective of an exemplary integrated circuit with surface-emitting lasers. The metallised flanks of the 45° reflectors give rise to the desired surface emission.

2. Description of the Prior Art

In the prior art, the reflectors are generally obtained through etching by the ion machining of a substrate made of semiconductor materials of the III–V group. Then, in a second stage, deposits are made by epitaxial growth of the successive layers need to prepare the laser structure.

This type of method then includes a phase, which is always a difficult one, of conditioning the surface of the sample in order to prepare the renewal of epitaxial growth of the laser structure on the etched substrate.

In order to avoid this step of ion machining followed by the renewal of epitaxial growth of the laser structure on the 45° reflectors that are formed beforehand, the invention proposes a method of manufacture enabling the preparation of Bragg reflectors forming an angle θ with the substrate (this angle could be typically equal to about 45°). This is done through selective epitaxial growth by means of a mechanical mask. The making of such reflectors then makes it possible to eliminate the subsequent step of metallization of the reflectors as practised in the prior art. This is always a difficult step if it is desired not to damage the active faces of the laser structures, for these faces are very close to the reflecting flanks.

SUMMARY OF THE INVENTION

More specifically, an object of the invention is a method for the making of an optoelectronic power device that emits coherent light given by a plurality of surface-emitting elementary lasers, wherein said method comprises the following steps:

the making, through a mechanical mask with apertures having inclined flanks, of reflectors by the epitaxial growth of at least one semiconductor material, said reflectors having flanks that form an angle θ with the plane of the substrate on which they are made;

the growth by selective epitaxy of the constituent layers of the laser structure on said reflectors.

The desired angle θ may be adjusted by the distance between the mechanical mask and the plane of the substrate.

In the method according to the invention, it is thus possible, in a first stage, to achieve the growth of reflectors made of a semiconductor material (I) through the mechanical mask and then, in a second stage, after the removal of the mask in situ, to obtain the growth of Bragg mirrors by the selective epitaxy of (A) and (B) semiconductor materials.

According to another alternative, it is also possible, directly through the mechanical mask, to achieve the growth of Bragg mirrors by selective epitaxy of (A) and (B) semiconductor materials on the plane substrate.

It is then possible, in a second stage, to eliminate the laser structure at the Bragg mirrors so as to leave said laser structure only on the substrate elements inserted between two Bragg mirrors.

BRIEF DESCRIPTION OF THE DRAWINGS

The invention will be understood more clearly and other advantages shall appear from the following description, which is given by way of a non-restrictive example, and from the appended figures, of which:

FIG. 3 illustrates another example of a method according to the invention, wherein the Bragg mirrors are made on a substrate prepared by epitaxy through a mechanical mask;

FIG. 4 illustrates a step of ion etching at the end of the method, that can be used to make wells needed to prepare the laser structures;

FIG. 5 illustrates a sub-etching step following the step illustrated in FIG. 4:

FIG. 5a gives a schematic view of a sub-etching step of chemical corrosion,

MORE DETAILED DESCRIPTION

Figure 1:
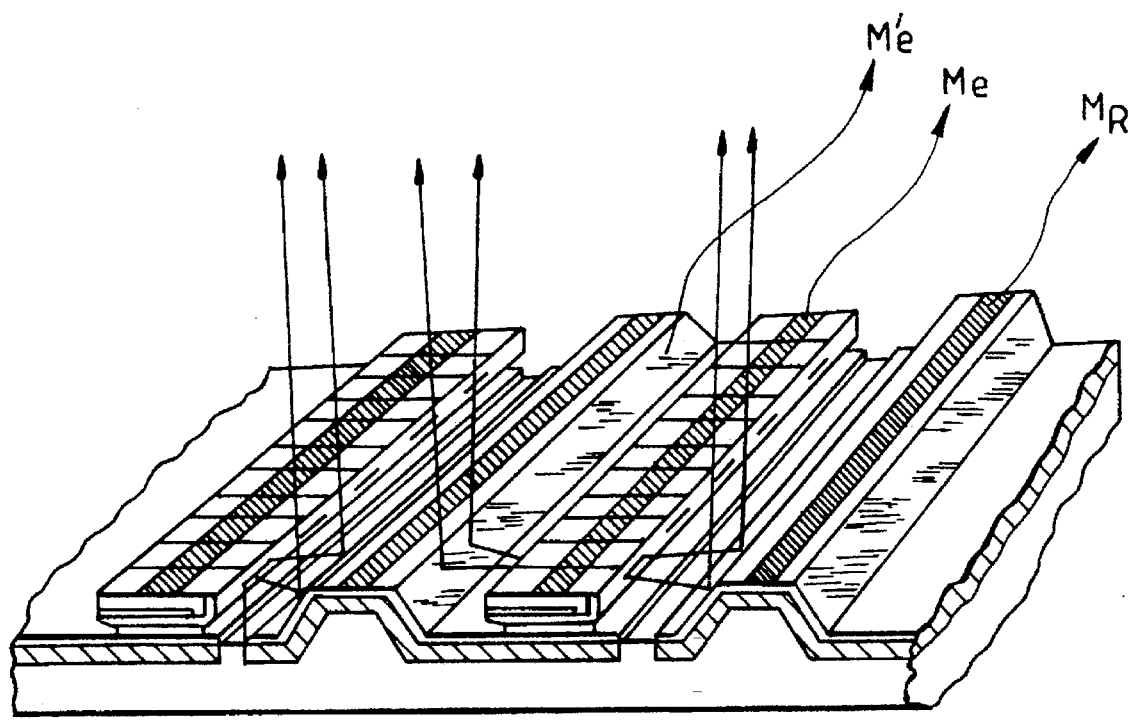
FIG. 1 shows a comprehensive view of an optoelectronic power device that is an emitter of coherent light given by a plurality of surface-emitting elementary lasers.
Figure 2:
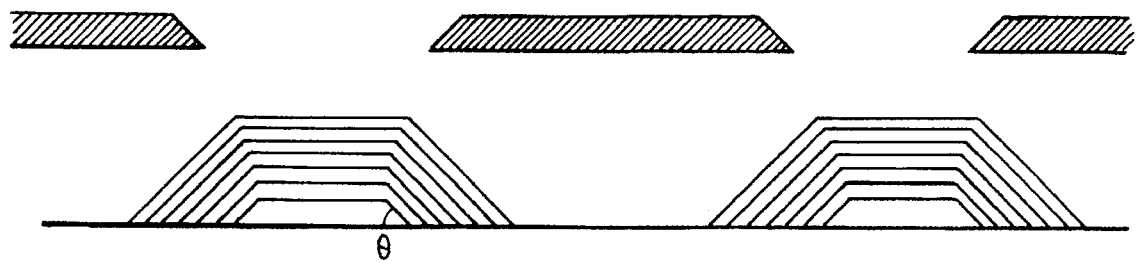
FIG. 2 illustrates a step of the method for making devices similar to the device shown in FIG. 1, using a mechanical mask to prepare the Bragg mirrors.

The method according to the invention for making an optoelectronic device comprising surface-emitting laser elements preferably uses a substrate made of group III–V materials. The materials used may typically be GaAs or InP. Starting with such a substrate and using a mechanical mask with controlled geometry, having apertures with optical flanks as shown schematically in FIG. 2, it is possible, by adjusting the ratio between the aperture and the distance of the mask, to make trapezoidal structures with flanks that may be typically at an angle of 45° with respect to the substrate. It is thus possible, by means of alternating deposits of semiconductor materials such as GaAlAs and GaAs, to make layers with a thickness equal to a quarter of the wavelength of the semiconductor laser that is subsequently made. Typically, in the case of lasers emitting at 0.8 μm, the constituent layers of the Bragg reflectors have a thickness of about 0.2 μm. The reflective elements thus prepared may advantageously have a height in the region of 20 μm.

Figure 3A:
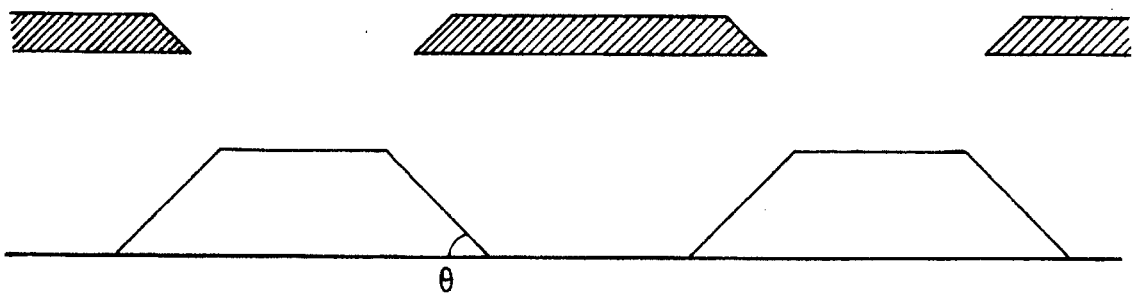
FIG. 3a gives a schematic view of the making of the reflectors through the mechanical mask.
Figure 3B:
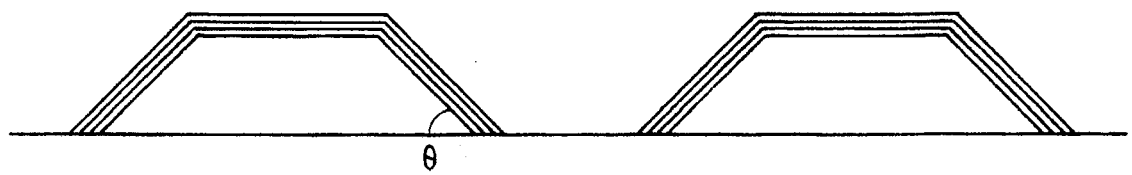
FIG. 3b gives a schematic view of the making of the Bragg mirrors on the previously formed reflectors.

It is also possible to make reflectors with Bragg mirrors in two stages. That is, it is possible, in a first stage, to make a reflector of GaAs type material through a mechanical mask such as the one described here above. Then, in a second stage, the mechanical mask may be removed in situ to prepare the alternation of GaAs/GaAlAs layers by selective epitaxy, making it possible to obtain the desired Bragg mirrors (FIGS. 3a and 3b).

The last constituent layer of the Bragg may typically be made of GaAlAs and may thus also play the role of a so-called barrier layer in the sub-etching step described here below.

In both examples, there is a set of reflectors having flanks forming an angle θ with the substrate.

It is then possible to achieve the in situ growth of the laser structure on the substrate comprising the Bragg reflectors.

In a first stage, it is possible to deposit a thick (about 6 μm thick) layer ($C_I$) of GaAs capable of being etched by a solution that does not corrode GaAlAs.

Then a sequence of the following is made: optical confinement layers ($C_{II}$) made of GaAlAs, a set of layers ($C_{III})_i$ needed for the laser structure proper made by prior art methods, a second confinement layer ($C_{IV}$) made of GaAlAs.

Ion etching is then used to make wells locally up to the layer ($C_I$) as shown in FIG. 4.

Figure 5B:
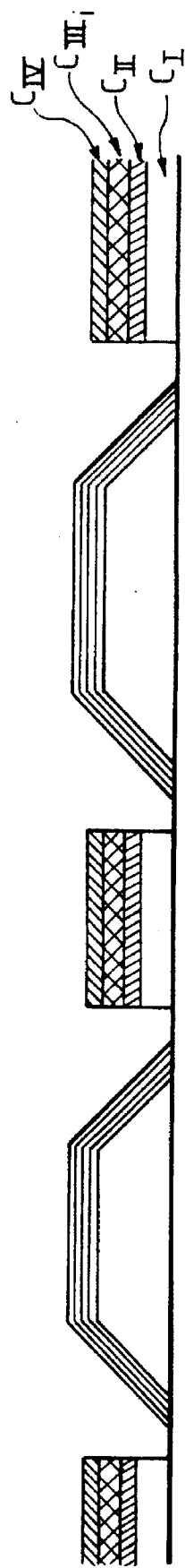
FIG. 5b gives a schematic view of a step for the machining of the "struts" obtained at the end of the previous step.

Thus, by chemical etching with a selective solution (of the citric acid, $H_2O_2$, $H_2O$ type), sub-etching is carried out to make the "struts" such as those shown in FIG. 5a. In a last stage, ion etching is used to eliminate the overhanging parts (FIG. 5b).

Figure 6:
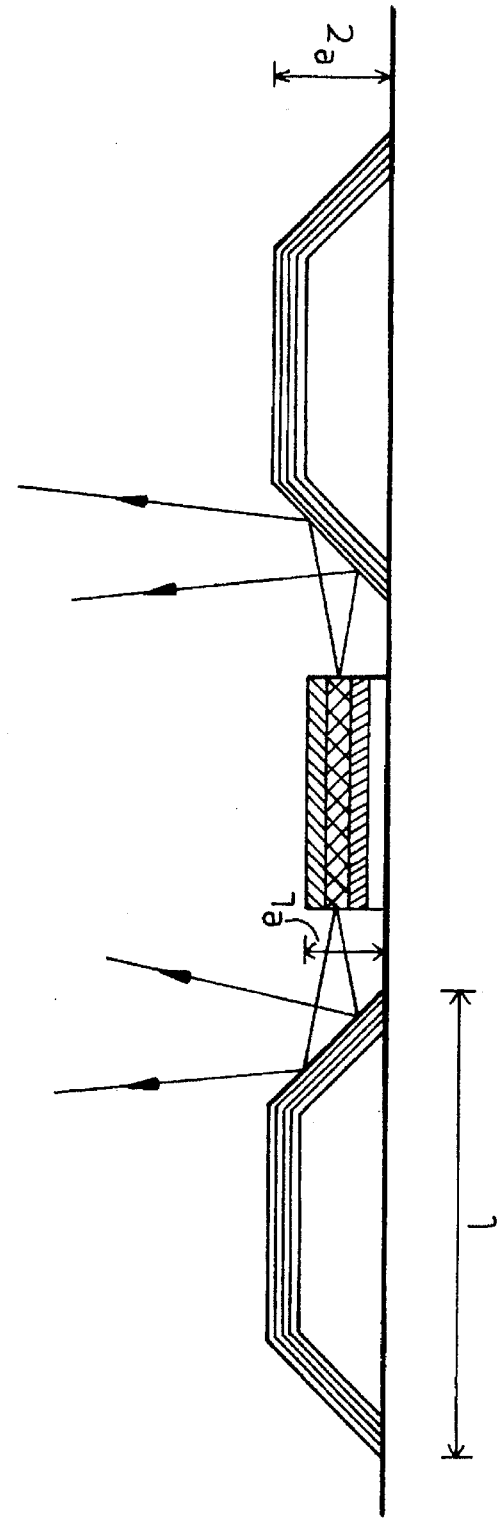
FIG. 6 illustrates a set of laser diodes obtained according to the method of the invention.

Thus, a set of surface-emitting laser diodes is obtained. The thickness $e_L$ of these diodes, shown in FIG. 6, is preferably smaller than that of the reflectors having thicknesses $e_r$, so as to recover the divergent emission of said diodes as efficiently as possible. This divergent emission, typically $e_L$, may be in the range of 12 μm if $e_r$ is in the range of 20 μm. In these examples, the width 1 of the reflectors may typically be in the range of 40 to 50 μm.

What is claimed is:

1. A method for the making of an optoelectronic power device that emits coherent light given by a plurality of surface-emitting elementary lasers, wherein said method comprises the following steps:

the making, through a mechanical mask with apertures having inclined flanks, of reflectors by the epitaxial growth of at least one semiconductor material, said reflectors having flanks that form an angle θ with the plane of the substrate on which they are made;

the growth by selective epitaxy of the constituent layers of the laser structure on said reflectors.

2. A method for the making of an optoelectronic device according to claim 1, wherein:

in a first stage, the growth of reflectors made of a semiconductor material (I) is obtained through the mechanical mask, in a second stage, after the removal of the mask in situ, the growth of Bragg mirrors is obtained by operations of selective epitaxy of (A) and (B) semiconductor materials.

3. A method for making an optoelectronic device according to claim 1, wherein the growth of the Bragg mirrors is obtained through the mechanical mask by operations of selective epitaxy of (A) and (B) semiconductor materials on a plane substrate.

4. A method for making an optoelectronic device according to claim 1, wherein the substrate is made of GaAs.

5. A method for making an optoelectronic device according to claim 2, wherein the material (A) is GaAs and the material (B) is GaAlAs.

6. A method for making an optoelectronic device according to claim 2, wherein the material (I) is GaAs.

* * * * *